(12) United States Patent
Champion

(10) Patent No.: US 8,610,000 B2
(45) Date of Patent: Dec. 17, 2013

(54) CIRCUIT BOARD FOR AN ELECTRICAL CONNECTOR

(75) Inventor: Bruce Allen Champion, Camp Hill, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 132 days.

(21) Appl. No.: 13/269,008

(22) Filed: Oct. 7, 2011

(65) Prior Publication Data

US 2013/0090014 A1  Apr. 11, 2013

(51) Int. Cl.
*H05K 7/06* (2006.01)
(52) U.S. Cl.
USPC .......................... 174/262; 439/676; 361/794
(58) Field of Classification Search
USPC .............................. 439/676; 361/794; 174/262
See application file for complete search history.

(56) References Cited

U.S. PATENT DOCUMENTS

| | | | | |
|---|---|---|---|---|
| 4,298,770 A | * | 11/1981 | Nishihara et al. | 174/262 |
| 4,636,919 A | * | 1/1987 | Itakura et al. | 361/794 |
| 6,431,918 B1 | * | 8/2002 | Givens et al. | 439/676 |
| 6,816,025 B2 | | 11/2004 | Nguyen | |
| 7,201,618 B2 | | 4/2007 | Ellis et al. | |
| 7,372,143 B2 | * | 5/2008 | Nakamura et al. | 257/698 |
| 7,448,909 B2 | * | 11/2008 | Regnier et al. | 439/607.05 |
| 7,459,638 B2 | * | 12/2008 | Chen et al. | 174/255 |
| 7,652,364 B2 | | 1/2010 | Knighten et al. | |
| 7,676,919 B2 | * | 3/2010 | Zhao et al. | 29/852 |
| 8,076,590 B2 | * | 12/2011 | Zhao et al. | 174/262 |
| 2006/0091545 A1 | * | 5/2006 | Casher et al. | 257/738 |
| 2006/0266549 A1 | * | 11/2006 | Lin et al. | 174/262 |

* cited by examiner

*Primary Examiner* — Truc Nguyen

(57) ABSTRACT

A circuit board includes a substrate having upper and lower sides, and first and second conductive vias extending between the upper and lower sides. The first and second conductive vias include circular outer profiles. The circuit board also includes a differential pair of conductive traces, which includes a first conductive trace having first upper and lower segments disposed on the upper and lower sides, respectively. The first upper and lower segments are electrically connected together through the first conductive via. The first upper segment is curved around the second conductive via such that the first upper segment follows the circular outer profile of the second conductive via. The differential pair of conductive traces also includes a second conductive trace having second upper and lower segments disposed on the upper and lower sides, respectively. The second upper and lower segments are electrically connected together through the second conductive via. The first upper segment crosses over the second lower segment. The second lower segment is curved around the first conductive via such that the second lower segment follows the circular outer profile of the first conductive via.

20 Claims, 5 Drawing Sheets

CIRCUIT BOARD FOR AN ELECTRICAL CONNECTOR

BACKGROUND OF THE INVENTION

The subject matter described and/or illustrated herein relates generally to circuit boards.

In electrical systems, one source of signal degradation is crosstalk between multiple signal paths. Crosstalk occurs when signals conducted over a signal path are partly transferred by inductive and/or capacitive coupling into another signal path. For example, a typical industry standard type RJ-45 communications connector includes four differential pairs of contacts defining different signal paths. In conventional RJ-45 plug and jack connectors, the differential pairs of contacts extend closely parallel to one another, which may induce crosstalk between and/or among different differential pairs of the contacts.

Various approaches have been implemented to reduce, counteract, and/or suppress crosstalk within RJ-45 connectors. For example, some of the differential pairs of contacts with RJ-45 jack connectors include crossover segments wherein the contacts within a pair cross over each other. Such crossover segments facilitate balancing coupling with neighboring differential pairs on opposite sides of the crossover pair by reversing the orientation of the contacts within the crossover pair. Another approach to balancing coupling between different signal paths is splitting the contacts of one differential pair around another differential pair. However, the contacts of the crossover pairs may need to be reversed into the original orientation to align with another electrical component of the jack connector. Similarly, the contacts of a split pair may need to be brought closer together for alignment with another electrical component of the jack connector. For example, RJ-45 jack connectors sometimes include magnetic packages. However, the pattern of the contacts of the magnetic package groups the contacts within a differential pair relatively close together and in the original orientation of the crossover pair. Accordingly, the circuit boards of at least some known jack connectors have electrical traces that cross over each other or are routed relatively closer together to compensate for any crossover and split pairs of contacts. But, crossing over or bringing the electrical traces closer together may cause mismatching of differential pairs, which may result in signal degradation.

There exists a need for reducing or eliminating the mismatching of differential pairs on a circuit board.

BRIEF DESCRIPTION OF THE INVENTION

In one embodiment, a circuit board includes a substrate having upper and lower sides, and first and second conductive vias extending between the upper and lower sides. The first and second conductive vias include circular outer profiles. The circuit board also includes a differential pair of conductive traces, which includes a first conductive trace having first upper and lower segments disposed on the upper and lower sides, respectively. The first upper and lower segments are electrically connected together through the first conductive via. The first upper segment is curved around the second conductive via such that the first upper segment follows the circular outer profile of the second conductive via. The differential pair of conductive traces also includes a second conductive trace having second upper and lower segments disposed on the upper and lower sides, respectively. The second upper and lower segments are electrically connected together through the second conductive via. The first upper segment crosses over the second lower segment. The second lower segment is curved around the first conductive via such that the second lower segment follows the circular outer profile of the first conductive via.

In another embodiment, an electrical connector includes a housing and a contact sub-assembly held by the housing. The contact sub-assembly includes a circuit board and an array of mating contacts that are electrically connected to the circuit board. The mating contacts are arranged in differential pairs. One of the mating contacts of at least one of the differential pairs includes a cross-over section that crosses over the other mating contact of the differential pair. The circuit board includes a substrate having upper and lower sides, and first and second conductive vias extending between the upper and lower sides. The first and second conductive vias include circular outer profiles. The circuit board also includes a differential pair of conductive traces, which includes a first conductive trace having first upper and lower segments disposed on the upper and lower sides, respectively. The first upper and lower segments are electrically connected together through the first conductive via. The first upper segment is curved around the second conductive via such that the first upper segment follows the circular outer profile of the second conductive via. The differential pair of conductive traces also includes a second conductive trace having second upper and lower segments disposed on the upper and lower sides, respectively. The second upper and lower segments are electrically connected together through the second conductive via. The first upper segment crosses over the second lower segment. The second lower segment is curved around the first conductive via such that the second lower segment follows the circular outer profile of the first conductive via.

In another embodiment, a circuit board includes a substrate having upper and lower sides, first and second conductive vias extending between the upper and lower sides, and a differential pair of conductive traces. The differential pair of conductive traces includes a first conductive trace having first upper and lower segments disposed on the upper and lower sides, respectively. The first upper and lower segments are electrically connected together through the first conductive via. The first upper segment is curved around the second conductive via at a distance from an outer profile of the second conductive via that is less approximately eleven mils. The differential pair of conductive traces also includes a second conductive trace having second upper and lower segments disposed on the upper and lower sides, respectively. The second upper and lower segments are electrically connected together through the second conductive via. The first upper segment crosses over the second lower segment. The second lower segment is curved around the first conductive via a distance from an outer profile of the first conductive via that is less approximately eleven mils.

DETAILED DESCRIPTION OF THE INVENTION

Figure 1:
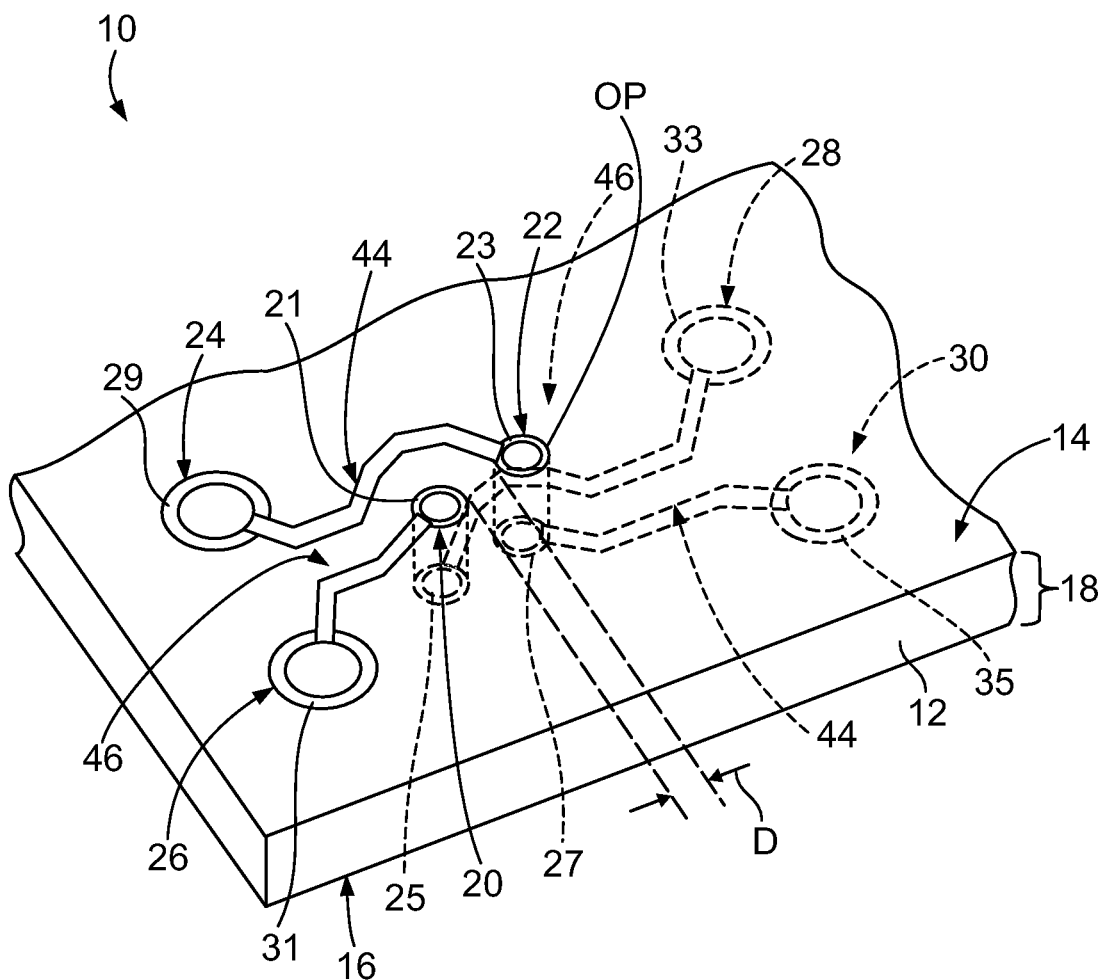
FIG. 1 is a perspective view of an exemplary embodiment of a circuit board.

FIG. 1 is a perspective view of an exemplary embodiment of a circuit board 10. The circuit board 10 includes a substrate 12 having a pair of opposite sides 14 and 16. In the exemplary embodiment, the substrate 12 is defined by a single layer 18. Each of the sides 14 and 16 defines an exterior side of the layer 18. Alternatively, the substrate 12 is defined by plurality of layers (not shown). When the substrate 12 is defined by a plurality of layers, each layer will include at least one side that defines an interior side of the substrate 12. Each of the sides 14 and 16 may be referred to herein as an "upper" side and/or a "lower" side.

The circuit board 10 includes a plurality of electrically conductive vias 20, 22, 24, 26, 28, and 30. The vias 20 and 22 extend between the sides 14 and 16 of the substrate 12. Specifically, the vias 20 and 22 each extend from the side 14 to the side 16 and completely through the substrate 12 therebetween. The vias 20 and 22 include an electrically conductive material that extends from the side 14 to the side 16. The electrically conductive material of each via 20 and 22 includes a pad 21 and 23, respectively, that extends on the side 14 of the substrate 12. The electrically conductive material of each via 20 and 22 also includes a respective pad 25 and 27 that extends on the side 16 of the substrate 12. Each of the vias 20 and 22 defines an electrical path that extends through the substrate 12 from the side 14 to the side 16.

Each of the vias 24, 26, 28, and 30 also includes an electrically conductive material. The vias 24 and 26 extend into the side 14 of the substrate 12 and include respective pads 29 and 31 of the electrically conductive material that extend on the side 14. The vias 24 and 26 define electrical paths that extend from the side 14 into the substrate 12. The vias 28 and 30 extend into the side 16 of the substrate 12 and include respective pads 33 and 35 of the electrically conductive material that extend on the side 16. Each of the vias 28 and 30 defines an electrical path that extends from the side 16 into the substrate 12. Optionally, the vias 24, 26, 28, and/or 30 extend from the side 14 to the side 16 such that the vias 24, 26, 28, and 30 define electrical paths that extend from the side 14 to the side 16 of the substrate 12. The vias 24 and/or 26 may include a pad (not shown) of the electrically conductive material thereof on the side 16 of the substrate 12 in embodiments wherein the vias 24 and/or 26 extend from the side 14 to the side 16. The vias 28 and/or 30 may include a pad (not shown) of the electrically conductive material thereof on the side 14 of the substrate 12 in embodiments wherein the vias 28 and/or 30 extend from the side 16 to the side 14.

In the exemplary embodiment, each of the pads 21, 23, 25, 27, 29, 31, 33, and 35 has a circular outer profile, as can be seen in FIG. 1. For clarity, only the outer profile of the pad 25 is labeled in FIG. 1 with OP. The outer profiles OP of the pads 21, 23, 25, 27, 29, 31, 33, and 35 will be considered herein as the outer profiles OP of the respective vias 20, 22, 24, 26, 28, and 30. Alternatively, one or more of the pads 21, 23, 25, 27, 29, 31, 33, and/or 35 has an outer profile OP having a different shape, such as, but not limited to, an oval shape, square, rectangular, and/or the like. Although in the exemplary embodiment the circuit board 10 includes six vias, the circuit board 10 may include any number of vias. The vias 20 and 22 may each be referred to herein as a "first" conductive via and/or "second" conductive via. Each of the vias 24, 26, 28, and 30 may be referred to herein as a "third" conductive via and/or a "fourth" conductive via.

The vias 20 and 22 may be located any distance apart from each other. Optionally, the smallest distance D between the outer profiles of the vias 20 and 22 is approximately equal to or less than 10 mils and/or less than or equal to approximately 5 mils. In some embodiments, the smallest distance D between the outer profiles of the vias 20 and 22 is between approximately 4 mils and approximately 11 mils.

The circuit board 10 includes a pair of electrically conductive traces 44 and 46 that define a differential pair. Each of the traces 44 and 46 includes an electrically conductive material disposed on the substrate 12. Generally, the trace 44 electrically connects the via 24 to the via 30, while the trace 46 electrically connects the via 26 to the via 28. As will be described in more detail below, the traces 44 and 46 are curved around the vias 20 and 22, respectively. The traces 44 and 46 may each be referred to herein as a "first" conductive trace and/or a "second" conductive trace.

Figure 2:
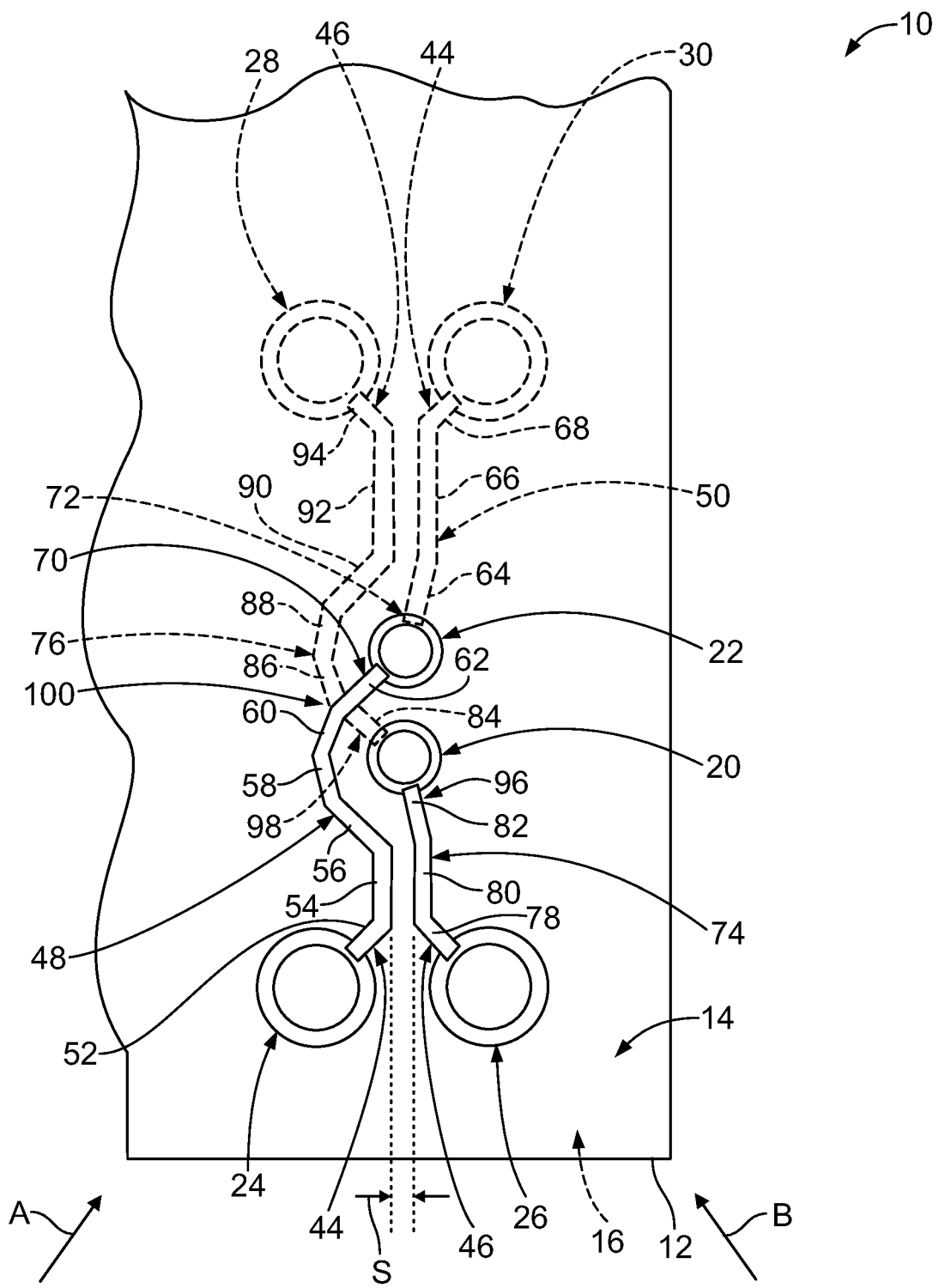
FIG. 2 is a top plan view of the circuit board shown in FIG. 1 illustrating one side of the circuit board.
Figure 3:
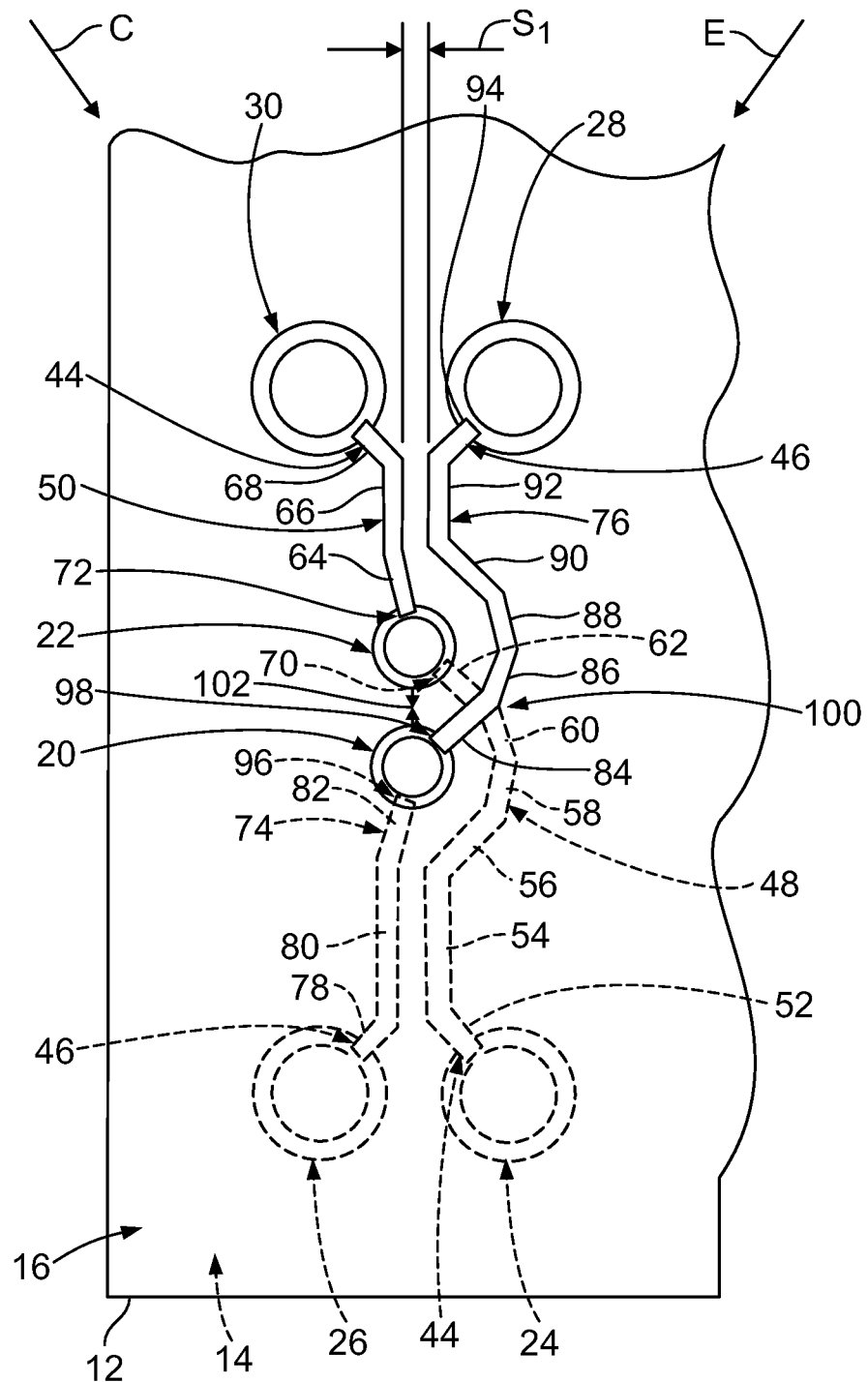
FIG. 3 is a bottom plan view of the circuit board shown in FIG. 1 illustrating an opposite side of the circuit board.

FIG. 2 is a top plan view of the circuit board 10 illustrating the side 14. FIG. 3 is a bottom plan view of the circuit board 10 illustrating the side 16. Referring now to FIGS. 2 and 3, the trace 44 includes a segment 48 and a segment 50. The segment 48 is disposed on the side 14 of the substrate 12, while the segment 50 is disposed on the side 16 of the substrate 12. Optionally, the segment 48 is defined by a plurality of straight sub-segments 52, 54, 56, 58, 60, and 62 that are angled relative to each other. Although six are shown and described herein, the segment 48 may be defined by any number of sub-segments. Optionally, the segment 50 is defined by straight sub-segments 64, 66, and 68 that are angled relative to each other. Accordingly, in the exemplary embodiment, the segment 50 is defined by three sub-segments. But, the segment 50 may be defined by any number of sub-segments.

The segment 48 of the trace 44 extends a length from the via 24 to the via 22 in electrical connection therewith. The segment 48 defines an electrical path on the side 14 of the substrate 12 from the via 24 to the via 22. The segment 50 is electrically connected to the vias 22 and 30 and extends a length on the side 16 of the substrate 12 from the via 22 to the via 30. The segment 50 defines an electrical path on the side 16 of the substrate 12 from the via 22 to the via 30. The segments 48 and 50 are electrically connected together through the via 22. More specifically, the via 22 defines an electrical path from an end 70 of the segment 48, through the thickness (defined between the sides 14 and 16) of the substrate 12, to an end 72 of the segment 50. The trace 44 and the via 22 thereby define an electrical path from the via 24 on the side 14 of the substrate 12 to the via 30 on the side 16 of the substrate 12. The segments 48 and 50 may each be referred to herein as a "first upper" segment, a "first lower" segment, a "second upper" segment, and/or a "second lower" segment.

The trace 46 includes segments 74 and 76. The segment 74 is disposed on the side 14 of the substrate 12. The segment 76 is disposed on the side 16 of the substrate 12. Optionally, the segment 74 is defined by straight sub-segments 78, 80, and 82 that are angled relative to each other, and/or the segment 76 is defined by straight sub-segments 84, 86, 88, 90, 92, and 94 that are angled relative to each other. Although the segments 74 and 76 include three and six sub-segments, respectively, in the exemplary embodiment, each of the segments 74 and 76 may be defined by any number of sub-segments.

The segment 74 is electrically connected to the vias 26 and 20 and extends a length on the side 14 of the substrate 12 from the via 26 to the via 20. The segment 74 defines an electrical path on the side 14 from the via 26 to the via 20. The segment 76 extends a length on the side 16 of the substrate 12 from the via 20 to the via 28 in electrical connection therewith. The segment 76 defines an electrical path from the via 20 to the via 28 on the side 16 of the substrate 12. The segments 74 and 76 are electrically connected together through the via 20. The via 20 electrically connects an end 96 of the segment 74 to an end 98 of the segment 76. The via 20 thereby defines an electrical path through the thickness of the substrate 12 from the segment 74 to the segment 76. The trace 46 and the via 20 define an electrical path from the via 26 on the side 14 of the substrate 12 to the via 28 on the side 16 of the substrate 12. The segments 74 and 76 may each be referred to herein as a "first upper" segment, a "first lower" segment, a "second upper" segment, and/or a "second lower" segment.

Although each of the traces 44 and 46 is shown and described herein as being disposed on the exterior sides 14 and 16 of the substrate 12, alternatively, in embodiments wherein the substrate 12 includes a plurality of layers such that the substrate 12 includes at least two interior sides, the traces 44 and/or 46 may include one or more segments disposed on an interior side of the substrate 12.

The traces 44 and 46 cross over each other. In the exemplary embodiment, the segment 48 of the trace 44 crosses over the segment 76 of the trace 46, or vice versa depending on the orientation of the observer. For example, when viewed from the side 14 as in FIG. 2, the segment 48 of the trace 44 crosses over the segment 76 of the trace 46. When viewed from the side 16 as in FIG. 3, the segment 76 of the trace 46 crosses over the segment 48 of the trace 44. The traces 44 and 46 cross over at a crossover point 100. Optionally, the crossover point 100 is substantially aligned with a midpoint 102 (FIG. 3) between the vias 20 and 22. In some alternative embodiments, the segments 50 and 74 of the traces 44 and 46, respectively, cross over each other.

Optionally, the traces 44 and 46 have overall lengths that are substantially equal. The trace 44 has an overall length defined by the combined lengths of the segments 48 and 50. The length of the segment 48 is defined by the combined lengths of the sub-segments 52, 54, 56, 58, 60, and 62, while the length of the segment 50 is defined by the combined lengths of the sub-segments 64, 66, and 68. The trace 46 has an overall length defined by the combined lengths of the segments 74 and 76. The length of the segment 74 is defined by the combined lengths of the sub-segments 78, 80, and 82. The length of the segment 76 is defined by the combined lengths of the sub-segments 84, 86, 88, 90, 92, and 94. Optionally, the overall length of the trace 44 as defined by the combined lengths of the segments 48 and 50 is substantially equal to the overall length of the trace 46 as defined by the combined lengths of the segments 74 and 76. Each of the traces 44 and 46 may have any overall length.

Referring now solely to FIG. 2, the segments 48 and 74 of the respective traces 44 and 46 extend outwardly from the vias 24 and 26, respectively, in directions generally toward each other. More specifically, the sub-segment 52 of the segment 48 extends outwardly from the via 24 in a direction A that is angled generally toward a direction B in which the sub-segment 78 of the segment 74 extends outwardly from the via 26. The directions A and B may have any angle relative to each other. One example of the angle between the directions A and B includes, but is not limited to, an angle of approximately 90°. The angle between the directions A and B brings the segments 48 and 74 closer together on the side 14 of the circuit board 10. The angle between the directions A and B may be selected to provide a predetermined spacing S between the sub-segments 54 and 80 of the segments 48 and 74, respectively. The predetermined spacing S between the sub-segments 54 and 80 may be any amount, such as, but not limited to, less than or equal to approximately 10 mils and/or less than or equal to approximately 5 mils. In some embodiments, the predetermined spacing S between the sub-segments 54 and 80 is between approximately 4 mils and approximately 11 mils.

Referring now to FIG. 3, the segments 50 and 76 of the traces 44 and 46, respectively, extend outwardly from the vias 30 and 28, respectively, in directions generally toward each other. The sub-segment 68 of the segment 50 extends outwardly from the via 30 in a direction C that is angled generally toward a direction E in which the sub-segment 94 of the segment 76 extends outwardly from the via 28. The directions C and E may have any angle relative to each other, such as, but not limited to, an angle of approximately 90°. The angle between the directions C and E brings the segments 50 and 76 closer together on the side 16 of the circuit board 10. The angle between the directions C and E may be selected to provide a predetermined spacing $S_1$ between the sub-segments 66 and 92 of the segments 50 and 76, respectively. The predetermined spacing $S_1$ between the sub-segments 66 and 92 may be any amount, such as, but not limited to, less than or equal to approximately 10 mils and/or less than or equal to approximately 5 mils. In some embodiments, the predetermined spacing $S_1$ between the sub-segments 66 and 92 is between approximately 4 mils and approximately 11 mils.

Figure 4:
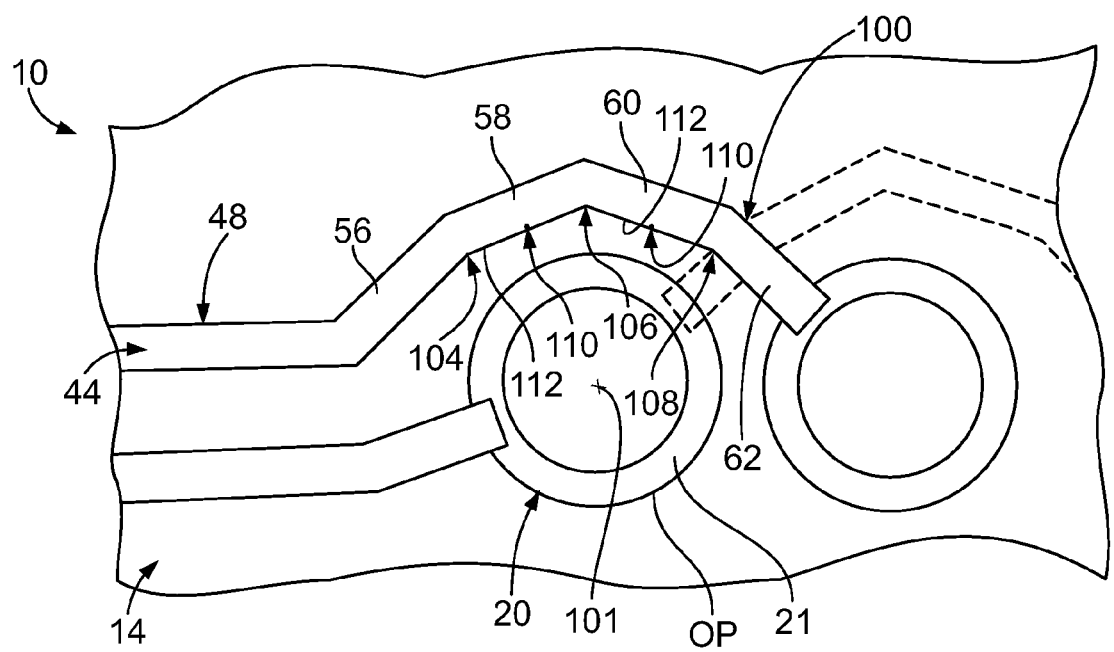
FIG. 4 is an enlarged plan view of a portion of the side of the circuit board shown in FIG. 2.

FIG. 4 is an enlarged plan view of a portion of the side 14 of the circuit board 10. The segment 48 of the trace 44 is curved around the via 20. The segment 48 thereby follows the circular outer profile OP of the via 20. As used herein, being "curved around the via 20" is intended to mean that the segment 48 substantially follows the circular outer profile OP of the via 20 along at least 90° of the circumference of the circular outer profile OP of the via 20. In the exemplary embodiment, the segment 48 substantially follows the circular outer profile OP of the via 20 along approximately 120° of the circumference of the circular outer profile OP of the via 20.

The curve of the segment 48 around the via 20 may be defined by one or more sub-segments having a round shape, by straight sub-segments that are angled relative to each other, or a combination thereof. In the exemplary embodiment, the curve of the segment 48 is defined by the straight sub-segments 56, 58, 60, and 62 that are angled relative to each other at three bends 104, 106, and 108. The bend 104 is defined at the intersection of the sub-segments 56 and 58 of the segment 48. The bend 106 is defined at the intersection of the sub-segments 58 and 60 of the segment 48, while the bend 108 is defined at the intersection of the sub-segments 60 and 62. In the exemplary embodiment, the bends 104, 106, and 108 are consecutive along the length of the segment 48 of the trace 44. In the exemplary embodiment, each of the bends 104, 106, and 108 has an angle of approximately 150° that faces the outer profile OP of the via 20. However, each of the bends 104, 106, and 108 may have any angle of less than 180° that faces the outer profile OP of the via 20. Although the segment 48 includes three bends 104, 106, and 108 for being curved around the via 20, in embodiments wherein the curve of the segment 48 only includes straight sub-segments that are angled relative to each other, the segment 48 may include any number of bends equal to or greater than three for being curved around the via 20. A greater number of bends having angles (that face the outer profile OP of the via 20) closer to 180° will provide a smoother curvature of the segment 48 around the via 20. Although the bends 104, 106, and 108 are shown as having sharp corners, alternatively the bends 104, 106, and/or 108 have rounded corners.

Optionally, and as can be seen in FIG. 4, the curvature of the segment 48 around the via 20 is concentric (about a central axis 101) with the circular outer profile OP of the via 20. In the exemplary embodiment, the segment 48 is curved around the via 20 at the cross-over point 100. More specifically, a portion of the segment 48 that at least partially defines the curvature of the segment 48 around the via 20 includes the cross-over point 100. In the exemplary embodiment, the sub-segment 62 of the segment 48 includes the cross-over point 100. But, in some alternative embodiments, the sub-segment 56, 58, or 60 of the segment 48 includes the cross-over point 100.

In the exemplary embodiment, midpoints 110 of the lengths of the sub-segments 58 and 60, as measured at edges 112 of the sub-segments 58 and 60 that face the via 20, are equidistant from the outer profile OP of the via 20. Alternatively, as measured at the edges 112, the midpoint 110 of the sub-segment 58 is located a different distance from the outer profile OP of the via 20 than the midpoint 110 of the sub-segment 60. As measured at the corresponding edge 112, the midpoint 110 of each sub-segment 56, 58, 60, and 62 may be located any distance from the outer profile OP of the via 20. In some embodiments, the midpoint 110 of one or more of the sub-segments 56, 58, 60, and 62, as measured at the edge 112, is located a distance from the outer profile OP of the via 20 of less than or equal to approximately 10 mils and/or less than or equal to approximately 5 mils. In some embodiments, the midpoint 110 of one or more of the sub-segments 56, 58, 60, and 62, as measured at the edge 112, is located a distance from the outer profile OP of the via 20 that is between approximately 4 mils and approximately 11 mils.

Figure 5:
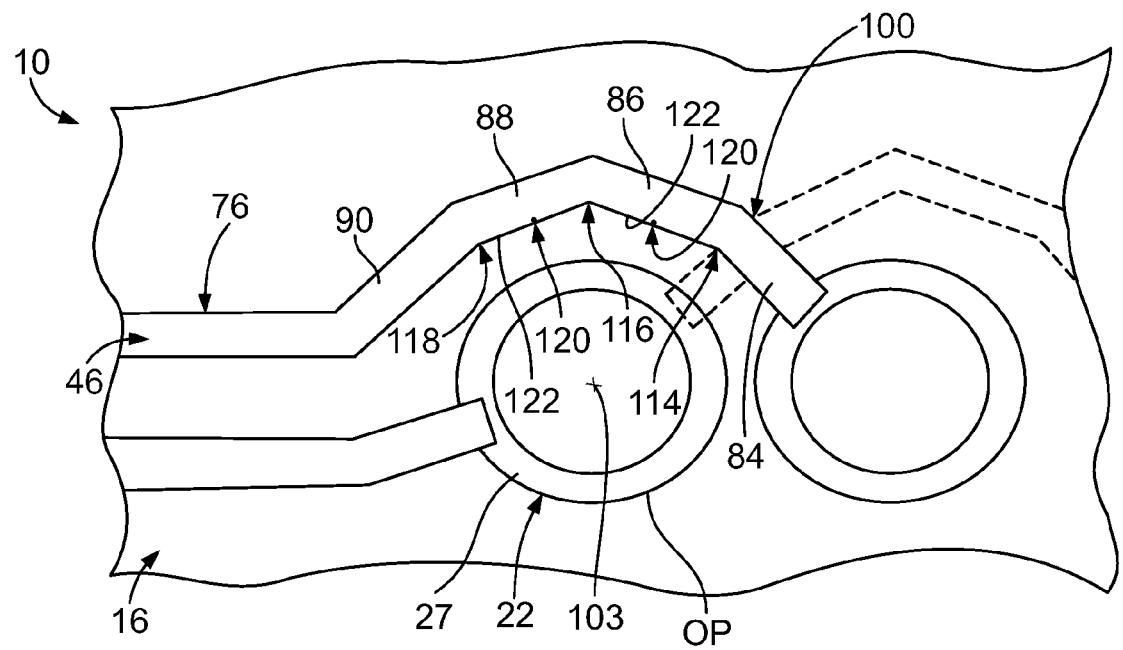
FIG. 5 is an enlarged plan view of a portion of the side of the circuit board shown in FIG. 3.

FIG. 5 is an enlarged plan view of a portion of the side 16 of the circuit board 10. The segment 76 of the trace 46 is curved around the via 22 such that the segment 76 follows the circular outer profile OP of the via 22. As used herein, being "curved around the via 22" is intended to mean that the segment 76 substantially follows the circular outer profile OP of the via 22 along at least 90° of the circumference of the circular outer profile OP of the via 22. In the exemplary embodiment, the segment 76 substantially follows the circular outer profile OP of the via 22 along approximately 120° of the circumference of the circular outer profile OP of the via 22.

The curve of the segment 76 around the via 22 may be defined by one or more sub-segments having a round shape, by straight sub-segments that are angled relative to each other, or a combination thereof. In the exemplary embodiment, the curve of the segment 76 is defined by the straight sub-segments 84, 86, 88, and 90 that are angled relative to each other at three bends 114, 116, and 118. The bend 114 is defined at the intersection of the sub-segments 84 and 86 of the segment 76, while the bend 116 is defined at the intersection of the sub-segments 86 and 88 and the bend 118 is defined at the intersection of the sub-segments 88 and 90. Optionally, the bends 114, 116, and 118 are consecutive along the length of the segment 76 of the trace 46. In the exemplary embodiment, each of the bends 114, 116, and 118 has an angle of approximately 150° that faces the outer profile OP of the via 22. But, each of the bends 114, 116, and 118 may have any angle of less than 180° that faces the outer profile OP of the via 22. In embodiments wherein the curve of the segment 76 only includes straight sub-segments that are angled relative to each other, the segment 76 may include any number of bends greater than or equal to three for being curved around the via 22. A greater number of bends having angles (that face the outer profile OP of the via 22) closer to 180° will provide a smoother curvature of the segment 76 around the via 22.

Although the bends 114, 116, and 118 are shown as having sharp corners, alternatively the bends 114, 116, and/or 118 have rounded corners.

The curvature of the segment 76 around the via 22 is optionally concentric (about a central axis 103) with the circular outer profile OP of the via 22. The segment 76 is curved around the via 22 at the cross-over point 100 in the exemplary embodiment. For example, the sub-segment 84 of the segment 76 includes the cross-over point 100. However, in some alternative embodiments, the sub-segment 86, 88, or 90 of the segment 76 includes the cross-over point 100.

In the exemplary embodiment, midpoints 120 of the lengths of the sub-segments 86 and 88, as measured at edges 122 thereof that face the via 22, are equidistant from the outer profile OP of the via 22. Alternatively, as measured at the edges 122, the midpoint 120 of the sub-segments 86 is located a different distance from the outer profile OP of the via 22 than the midpoint 120 of the sub-segment 88. As measured at the corresponding edge 122, the midpoint 120 of each sub-segment 84, 86, 88, and 90 may be located any distance from the outer profile OP of the via 22. In some embodiments, the midpoint 120 of one or more of the sub-segments 84, 86, 88, and 90, as measured at the edge 122, is located a distance from the outer profile OP of the via 22 of less than or equal to approximately 10 mils and/or less than or equal to approximately 5 mils. In some embodiments, the midpoint 120 of one or more of the sub-segments 84, 86, 88, and 90, as measured at the edge 122, is located a distance from the outer profile OP of the via 22 that is between approximately 4 mils and approximately 11 mils.

Figure 6:
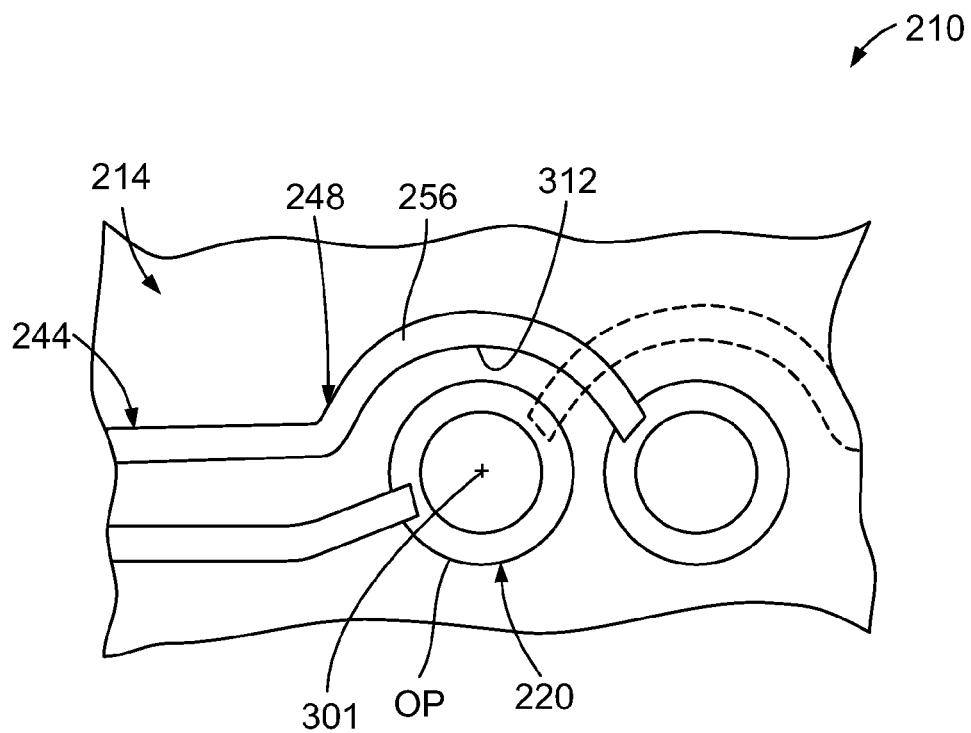
FIG. 6 is an enlarged plan view of a portion of a side of another exemplary embodiment of a circuit board.

FIG. 6 is an enlarged plan view of a portion of a side 214 of another embodiment of a circuit board 210. The circuit board 210 includes a trace 244 having a segment 248 that is curved around a via 220. The segment 248 thereby follows a circular outer profile OP of the via 220. As used herein, being "curved around the via 220" is intended to mean that the segment 248 substantially follows the circular outer profile OP of the via 220 along at least 90° of the circumference of the circular outer profile OP of the via 220. In the exemplary embodiment, the segment 248 substantially follows the circular outer profile OP of the via 220 along approximately 120° of the circumference of the circular outer profile OP of the via 220.

In the embodiment shown in FIG. 6, the curve of the segment 248 around the via 220 is defined by a sub-segment 256 having a round shape. Optionally, the curvature of the segment 248 around the via 220 is concentric (about a central axis 301) with the circular outer profile OP of the via 220. In some embodiments, the smallest distance between an edge 312 of the sub-segment 256 and the outer profile OP of the via 220 is less than or equal to approximately 10 mils and/or less than or equal to approximately 5 mils. In some embodiments, the smallest distance between the edge 312 of the sub-segment 256 and the outer profile OP of the via 220 is between approximately 4 mils and approximately 11 mils.

Figure 7:
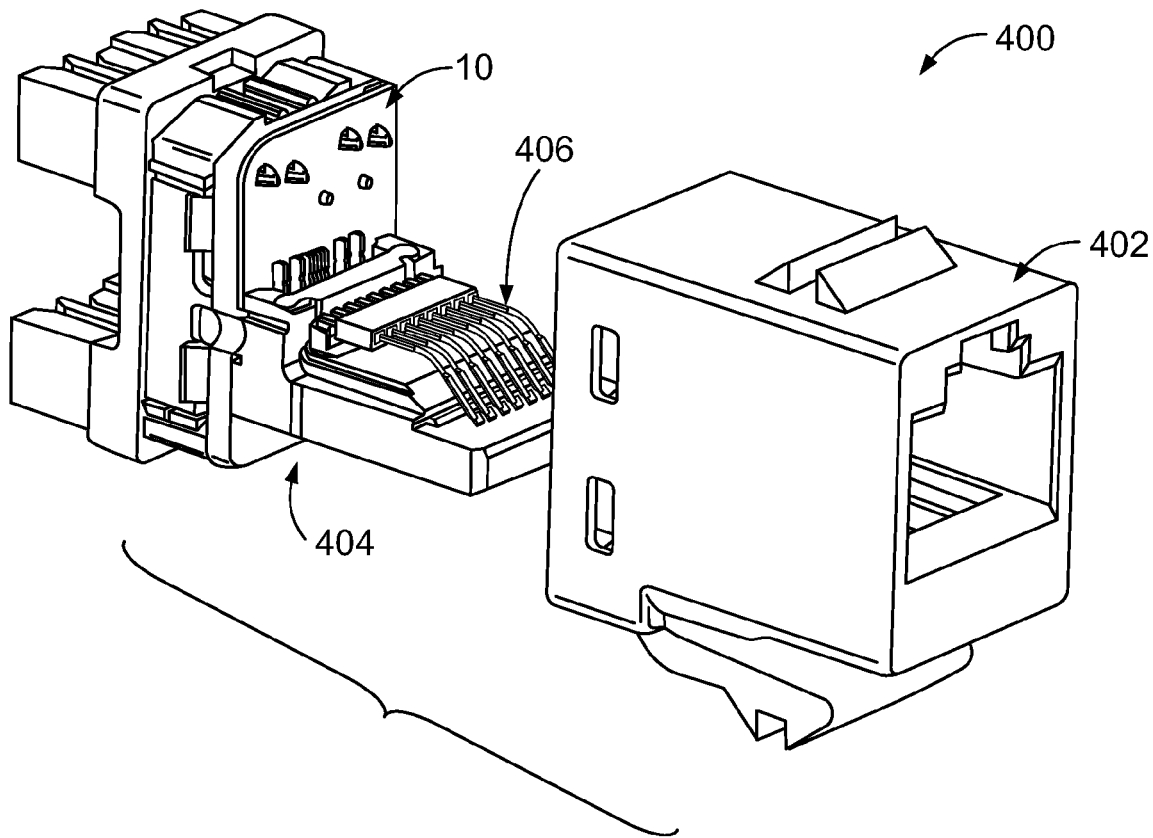
FIG. 7 is a partially exploded perspective view of a portion of an exemplary embodiment of an electrical connector that includes the circuit board shown in FIGS. 1-5.

FIG. 7 is a partially exploded perspective view of a portion of an exemplary embodiment of an electrical connector 400 that includes the circuit board 10. In an alternative embodiment, the electrical connector 400 includes the circuit board 210 shown in FIG. 6. The electrical connector 400 includes a housing 402 and a contact sub-assembly 404 held by the housing 402. The contact sub-assembly 404 includes an array of electrical contacts 406 that are configured to mate with corresponding electrical contacts (not shown) of a mating connector (not shown). The electrical contacts 406 are terminated to the circuit board 10, which is electrically connected to the wires (not shown) of a cable (not shown) that the electrical connector 400 terminates. The electrical contacts 406 are arranged in differential pairs, any of which may correspond to (i.e., be electrically connected to) the traces 44 and 46 (FIGS. 1-5).

In the exemplary embodiment, the electrical connector 400 is an RJ-45 jack. However, the circuit boards described and/or illustrated herein are not limited to RJ-45 jacks nor electrical connectors generally, but rather may be used with any other type of electrical connector and any other type of electrical component.

The embodiments described and/or illustrated herein may reduce or eliminate the mismatching of differential pairs on a circuit board. The embodiments described and/or illustrated herein may provide an electrical connector having an improved electrical performance. For example, the embodiments described and/or illustrated herein may provide an electrical connector having an improved electrical performance via reduced crosstalk.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. Moreover, the terms "first," "second," and "third," etc. in the claims are used merely as labels, and are not intended to impose numerical requirements on their objects. Dimensions, types of materials, orientations of the various components, and the number and positions of the various components described and/or illustrated herein are intended to define parameters of certain embodiments, and are by no means limiting and are merely exemplary embodiments. Many other embodiments and modifications within the spirit and scope of the claims will be apparent to those of skill in the art upon reviewing the description and illustrations. The scope of the subject matter described and/or illustrated herein should therefore be determined with reference to the appended claims, along with the full scope of equivalents to which such claims are entitled. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

While the subject matter described and/or illustrated herein has been described in terms of various specific embodiments, those skilled in the art will recognize that the subject matter described and/or illustrated herein can be practiced with modification within the spirit and scope of the claims.

What is claimed is:

1. A circuit board comprising:
a substrate having upper and lower sides;
first and second conductive vias extending between the upper and lower sides, the first and second conductive vias comprising circular outer profiles; and
a differential pair of conductive traces including:
a first conductive trace having first upper and lower segments disposed on the upper and lower sides, respectively, the first upper and lower segments being electrically connected together through the first conductive via, the first upper segment being curved around the second conductive via such that the first upper segment follows the circular outer profile of the second conductive via; and
a second conductive trace having second upper and lower segments disposed on the upper and lower sides, respectively, the second upper and lower segments being electrically connected together through the second conductive via, the first upper segment crossing over the second lower segment, the second lower segment being curved around the first conductive via such that the second lower segment follows the circular outer profile of the first conductive via.

2. The circuit board of claim 1, wherein the first upper segment is curved around the second conductive via at a plurality of sub-segments of the first upper segment that are angled relative to each other, the second lower segment being curved around the first conductive via at a plurality of sub-segments of the second segment that are angled relative to each other.

3. The circuit board of claim 1, wherein the first upper segment is curved around the second conductive via at a sub-segment comprising a round shape.

4. The circuit board of claim 1, wherein the first upper segment comprises at least three bends having an angle of less than 180° that faces the outer profile of the second conductive via, the second lower segment comprising at least three bends having an angle of less than 180° that faces the outer profile of the first conductive via.

5. The circuit board of claim 1, wherein the first upper segment is curved around the second conductive via at a plurality of sub-segments of the first upper segment that are angled relative to each other and that are equidistant from the outer profile of the second conductive via, the second lower segment being curved around the first conductive via at a plurality of sub-segments of the second segment that are angled relative to each other and that are equidistant from the outer profile of the first conductive via.

6. The circuit board of claim 1, wherein a curvature of the first upper segment is concentric with the circular outer profile of the second conductive via, a curvature of the second lower segment being concentric with the circular outer profile of the first conductive via.

7. The circuit board of claim 1, wherein the first upper segment crosses over the second lower segment at a cross-over point, the first upper segment and the second lower segment being curved around the outer profiles of the second and first conductive vias, respectively, at the cross-over point.

8. The circuit board of claim 1, wherein the first conductive trace has an overall length defined by the combined lengths of the first upper and lower segments, the second conducive trace having an overall length defined by the combined lengths of the second upper and lower segments, the overall length of the first conductive trace being substantially equal to the overall length of the second conductive trace.

9. The circuit board of claim 1, further comprising third and fourth conductive vias extending between the upper and lower sides, the first upper segment of the first conductive trace extending a length from the third conductive via to the first conductive via, the second upper segment of the second conductive trace extending a length from the fourth conductive via to the second conductive via, wherein the first upper segment and the second lower segment extend outwardly from the third and fourth conductive vias, respectively, in directions toward each other.

10. The circuit board of claim 1, wherein the first upper segment crosses over the second lower segment at a cross-over point that is substantially aligned with a midpoint between the first and second conductive vias.

11. The circuit board of claim 1, wherein the first upper segment comprises at least three consecutive bends having an angle of less than 180° that faces the outer profile of the second conductive via, the second lower segment comprising at least three consecutive bends having an angle of less than 180° that faces the outer profile of the first conductive via.

12. The circuit board of claim 1, wherein the first upper segment follows the circular outer profile of the second conductive via along at least approximately 120° of a circumference of the circular outer profile of the second conductive via, the second lower segment following the circular outer profile of the first conductive via along at least approximately 120° of a circumference of the circular outer profile of the first conductive via.

13. An electrical connector comprising:
a housing; and
a contact sub-assembly held by the housing, the contact sub-assembly comprising a circuit board and an array of mating contacts that are electrically connected to the circuit board, the mating contacts being arranged in differential pairs, one of the mating contacts of at least one of the differential pairs comprising a cross-over section that crosses over the other mating contact of the differential pair, wherein the circuit board comprises:
a substrate having upper and lower sides;
first and second conductive vias extending between the upper and lower sides, the first and second conductive vias comprising circular outer profiles;
third and fourth conductive vias extending between the upper and lower sides; and
a differential pair of conductive traces including:
a first conductive trace having first upper and lower segments disposed on the upper and lower sides, respectively, the first upper and lower segments being electrically connected together through the first conductive via, the first upper segment being curved around the second conductive via such that the first upper segment follows the circular outer profile of the second conductive via, the first upper segment of the first conductive trace extending a length from the third conductive via to the first conductive via; and
a second conductive trace having second upper and lower segments disposed on the upper and lower sides, respectively, the second upper and lower segments being electrically connected together through the second conductive via, the first upper segment crossing over the second lower segment, the second lower segment being curved around the first conductive via such that the second lower segment follows the circular outer profile of the first conductive via, the second upper segment of the second conductive trace extending a length from the fourth conductive via to the second conductive via, wherein the first upper segment and the second lower segment extend outwardly from the third and fourth conductive vias, respectively, in directions toward each other.

14. The electrical connector of claim 13, wherein the first upper segment is curved around the second conductive via at a sub-segment comprising a round shape.

15. The electrical connector of claim 13, wherein the first upper segment comprises at least three bends having an angle of less than 180° that faces the outer profile of the second conductive via, the second lower segment comprising at least three bends having an angle of less than 180° that faces the outer profile of the first conductive via.

16. The electrical connector of claim 13, wherein a curvature of the first upper segment is concentric with the circular outer profile of the second conductive via, a curvature of the second lower segment being concentric with the circular outer profile of the first conductive via.

17. The electrical connector of claim 13, wherein the first conductive trace has an overall length defined by the combined lengths of the first upper and lower segments, the second conducive trace having an overall length defined by the combined lengths of the second upper and lower segments, the overall length of the first conductive trace being approximately equal to the overall length of the second conductive trace.

18. The electrical connector of claim 13, wherein the first upper segment follows the circular outer profile of the second conductive via along at least approximately 120° of a circumference of the circular outer profile of the second conductive via, the second lower segment following the circular outer profile of the first conductive via along at least approximately 120° of a circumference of the circular outer profile of the first conductive via.

19. A circuit board comprising:
a substrate having upper and lower sides;
first and second conductive vias extending between the upper and lower sides; and
a differential pair of conductive traces including:
a first conductive trace having first upper and lower segments disposed on the upper and lower sides, respectively, the first upper and lower segments being electrically connected together through the first conductive via, the first upper segment being curved around the second conductive via at a distance from an outer profile of the second conductive via that is less than approximately eleven mils; and
a second conductive trace having second upper and lower segments disposed on the upper and lower sides, respectively, the second upper and lower segments being electrically connected together through the second conductive via, the first upper segment crossing over the second lower segment, the second lower segment being curved around the first conductive via a distance from an outer profile of the first conductive via that is less approximately eleven mils.

20. The circuit board of claim 19, wherein the smallest distance between the outer profiles of the first and second conductive vias is less approximately eleven mils.

* * * * *